May 7, 1963 R. W. BREILING 3,088,191

METHOD OF AND APPARATUS FOR MAKING PUNCH-BOARD WIRING CIRCUITS

Filed Jan. 2, 1957

Inventor:
Robert W. Breiling,
by Roe D. McBurnett
His Attorney.

United States Patent Office 3,088,191

Patented May 7, 1963

3,088,191

METHOD OF AND APPARATUS FOR MAKING PUNCH-BOARD WIRING CIRCUITS

Robert W. Breiling, Schenectady, N.Y., assignor to General Electric Company, a corporation of New York Filed Jan. 2, 1957, Ser. No. 632,080
2 Claims. (Cl. 29—155.5)

The present invention relates to an electrical circuit fabrication, and more particularly to processes for making punch-board wiring circuits.

Generally, present methods of dip soldering a wiring assembly involve the use of a printed circuit board, which normally consists of a conductor pattern in thin ribbons of copper cemented to an insulating board. The terminals, or pigtails, of electronic components are inserted through holes which pierce both the insulating board and the appropriate conductor ribbons. All electronic components are placed on one side of the insulating board, so that the other side of the board may be dipped into a solder pot which solders the projecting pigtails to the copper conductor ribbons through which they project.

In the use of such present methods, experience has shown that the application of metal panels, instead of insulating boards, is mandatory, or at least very desirable, for certain high impedance circuits which must work satisfactorily when exposed to an environment with high humidity and conditions conducive to condensation. For example, in the present fire control systems for high speed aircraft, insulating boards of melamine were causing such excessive malfunctioning in these systems in actual operation that the melamine boards had to be replaced by metal panels. The conversion to metal panels necessitated a change in the wiring assembly whereby conventional insulating standoffs and hand soldering techniques were again utilized.

Further, present wiring methods are endowed with several undesirable features which are tolerated only because of the lack of a better known wiring system. For example, in conventional printed circuits, field changes to the circuits cannot be readily accomplished, if at all, unless a major rebuilding job or project is undertaken. Rarely does a wiring assembly go through its development and design stages with all the "bugs" removed, and minor changes must frequently be made after the equipment has seen some field service. Thus, standard printed circuit techniques limit changes therein to only component value changes. Also, presently utilized insulating boards are poor thermal conductors and components utilized therewith, such as sub-miniature tubes and semi-conductors, must be mounted on an auxiliary metal panel to effect adequate heat dissipation in the circuit system.

Hence, the shortcomings of present wiring methods are abundant and have limited their use, for example, in expensive military and commercial equipment wherein the safety of personnel and fulfillment of a designated task depend on obtaining efficient longevity and reliability of service from electronic components and their associated wiring systems. For example, the inability of conductor ribbons located on the same side of the insulating board to cross each other presents a design limitation which frequently prevents optimum circuit layout. Also, the fact that surface leakage across the dielectric material is from conductor to conductor rather than from conductor to grounded chassis, may lead to circuit malfunction.

In addition, the insulating board is subject to warpage, particularly if the conductor ribbons are placed only on one side, as is generally the case in presently utilized wiring systems. In most cases, poor soldering will result from the cooling of the solder in the pot by the immersed insulated board and/or from gas pockets produced under the board by the vaporized flux when present wiring assemblies are dipped in the solder pot during the final fabrication step, as is done in most methods.

Another disadvantage of present circuit fabrication is the presence of undesirable "bridging," which is the joining of one conductor ribbon to another by solder picked up by the surface of the insulating board when the assembly is dip soldered. Also, the heat of the soldering step may weaken the adhesive used in these present wiring circuits to loosen the copper conductor ribbons from the insulating board. Another prevalent disadvantage is that circuit modification of completed assemblies is difficult since the cemented ribbon conductors cannot be re-routed on the board.

In accordance with the present invention, a hollow-turret terminal which uses a heat resistant insulator, made from such material as Teflon resin (solid polytetrafluoroethylene), or the like, is press fitted into a metal chassis in any of a number of circuit patterns. The terminals, or pigtails, as they are commonly called, of electronic components are inserted through the hollow-turret terminal and the extended length cut off to leave a small length projecting beyond the end of the turret terminal. Heat resistant insulated hookup wire is cut into appropriate length or sections and stripped at each end and the ends wrapped around the turrets of the predetermined terminals. The assembly is then fluxed and dipped into a solder pot slightly past the hollow-turret terminals while the chassis is maintained away therefrom.

In this manner, simultaneous soldering of all electronic components and wire mounted on a metal chassis is accomplished by being able to dip these various wire elements up to the hollow-turret terminals by the segregation of the components on one side of the chassis and the wire on the other. Accordingly, the invention is suitable for application to electronic assemblies where high quality and reliability are of paramount importance. The present invention lends itself to automation, while yet being susceptible to alteration of the basic wiring circuit, if necessary, after the unit has been put into operation.

In brief, the advantages of the present punch board wiring over the conventional printed circuit board are that the metal chassis permits mounting components directly thereon for heat dissipation, without the use of auxiliary metal panels, so that, for example, transistors may be mounted in metal holders riveted directly to the metal chassis. Further, the conductors, being insulated wire, may be crossed without limitation to provide unprecedented flexibility in circuit layout so necessary for optimum design.

Also, surface leakage across the hollow-turret terminal dielectric material is from conductor to grounded chassis, so that adjacent conductors are not affected by the leakage. In addition, the metal chassis is not subject to warpage and good soldering is achieved by merely immersing the hollow-turret terminals and the insulated hookup wire into the solder pot or bath. Thus, no bridging of solder occurs since there is no surface between the conductors to which solder can adhere. Accordingly, circuit modifications may be easily made as wires can be removed or re-routed between existing hollow-turret terminals, and new terminals may be readily added.

An object of the present invention is the provision of a process for constructing a punch-board wiring assembly utilizing a metal chassis for mounting electrical components directly thereon for better heat dissipation and without maintenance limitations to provide flexibility in circuit layout necessary for optimum design.

Another object is to provide a process for making a wiring assembly wherein the metal chassis is not immersed in solder but only the elements to be soldered so that no bridging of solder occurs.

A further object of the invention is the provision of a method of constructing a wiring circuit wherein wires may be removed or re-routed between existing terminals, and wherein new terminals may be added if desired.

An additional object of the present invention is the provision of a process for fabricating a punch-board wiring assembly in a predetermined pattern on a metal chassis which permits flexibility in circuit layout and provides excellent electrical contact between the circuit elements.

Another object of the invention is to provide an improved punch-board wiring assembly utilizing a metal panel and dip soldering techniques.

Other objects and many of the attendant advantages of this invention will be readily appreciated as the same becomes better understood by reference to the following detailed description when considered in connection with the accompanying drawing in which like reference numerals designate like parts throughout the figures thereof and wherein.

Figures 1, 2:
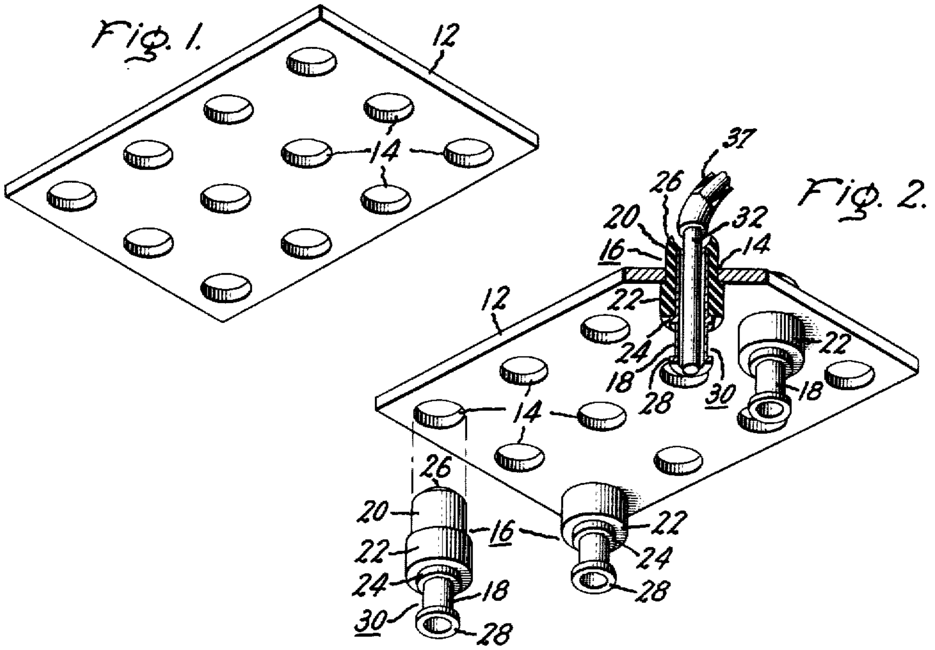
FIGURES 1 and 2 are perspective views illustrating the first and second steps in performing the preferred embodiment of the present invention.

Referring now to the drawings, there is illustrated in sequence, a process in accordance with the present invention wherein a punch-board metal panel 12 is shown with a predetermined number of holes 14 punched therethrough which serve as mounting means for a plurality of hollow-turret terminals 16. The metal panel 12 is prepared by punching, in a conventional manner, a number of suitable holes 14 in a predetermined pattern adaptable for the particular wiring assembly contemplated.

In the second operation shown by FIGURE 2 a number of hollow-turret terminal 16 are press fitted or otherwise secured in the metal panel 12, by hand or suitable automation, if such is desirable. Each turret terminal 16 comprises an inner lug 18 of metal, such as brass, or the like, surrounded with a heat resistant insulator material 20, such as Teflon resin, or the like. The heat resistant insulator is constructed with a configuration which will readily adapt the turret terminal 16 to be pressure-fitted within the corresponding aperture 14 previously punched in the metal panel or chassis 12. The insulator 20 of each turret terminal is formed with a flange 22 adapted to abut, if deemed desirable, against a flange 24 integral with the metal lug 18. The insulator is provided with a chamfer end 26 to facilitate the step of inserting the turret terminal within the corresponding receptacle aperture 14.

The metallic lug 18 is further formed with an end flange 28 which cooperates with the flange 24 to provide a turret 30 for operatively coupling thereto hookup wire ends, as hereinafter disclosed and with an axial aperture to permit the insertion of pigtails 32 of the various electronic components to be mounted on the chassis 12. The different components are secured to one side of the chassis 12 by various securing means, such as by riveting or bolting to the chassis, or may be secured by their pigtails alone. In this manner, a multitude of electronic components can be accommodated in the circuit, in any desired circuit pattern. After the terminals 16 are pressure fitted within the appropriate predetermined pattern, as indicated by the initial step of punching the apertures 14, the pigtails 32 of the electronic components, such as tubes or transistors 34 and capacitors 36, are inserted through the metallic lug 18 from one side of the chassis 12, as shown in FIGURE 2. If deemed desirable, the pigtails 32 may be provided with a heat resistant insulation 37, such as Teflon resin, or the like.

Figure 3:
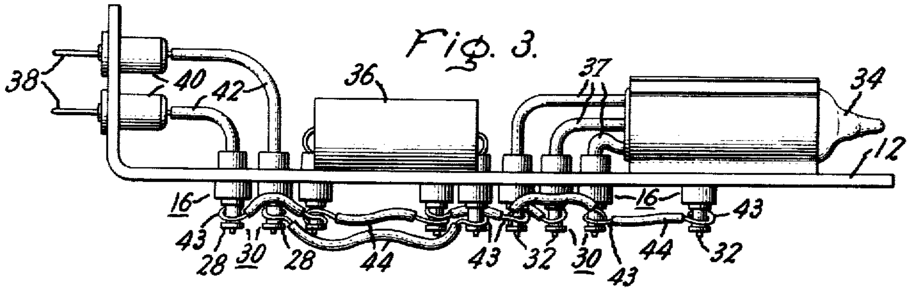
FIGURE 3 is a side view of the fabricated device illustrating the coupling of the hollow-turret terminals before the dip-soldering step of the preferred embodiment.

In the following step, FIGURE 3, a number of connector pin terminals 38 are mounted on the chassis 12 so as to form a connector. The terminals are provided with an insulator 40 which permits them to be pressure-fitted within suitable mounting apertures previously formed in the chassis 12. The connector pin terminals 38 are provided with wire extensions 42 to be electrically tied-in to their respective turret terminals 16. In accordance with the present invention, FIGURE 3 illustrates a punch-board wiring circuit utilizing a number of electronic components having their respective pigtails 32 inserted within the terminals 16 and readied for soldering the various contacts. The metal turrets 30, protruding from only one side of the chassis 12, are predeterminedly interconnected by means of a plurality of hookup wire sections 43 provided with a heat resistance insulation 44, such as Teflon resin, or the like. Before applying the sections 43 to the circuit, each section is stripped at each end, and the ends wrapped around their respective turret 30. It will be obvious that a number of sections 43 can have their respective ends tied about one of the turrets 30, if such is required by the installation. After the hookup wire sections 43 have been wrapped around the appropriate turret 30, the next operation is to flux the turret side of the chassis 12 in any one of a number of conventional ways, such as by dipping into a flux bath, or the like.

Figure 4:
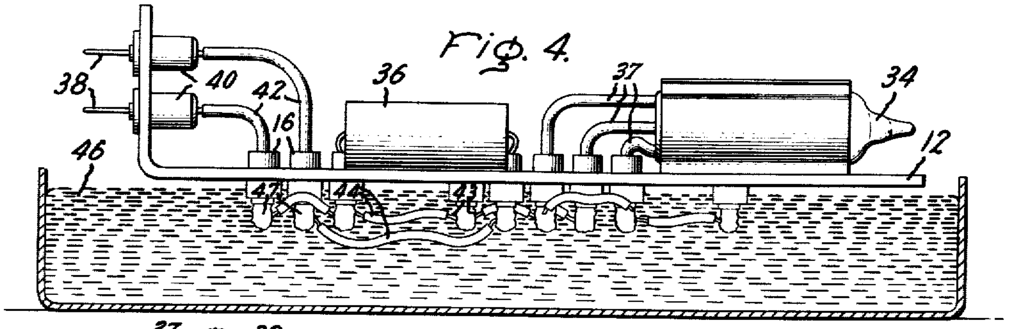
FIGURE 4 is a view similar to FIGURE 3, and illustrating the dip-soldering step.

In the final step of FIGURE 4, the fluxed turret side of the completely wired panel 12 is immersed in a solder bath 46. The insulated hookup wire sections 43 are also immersed in solder while the chassis 12 is maintained free of solder. In this manner, the hollow-turret terminals 16 permit the segregation of electrode components on one side of the chassis 12 and hookup wire sections 43 on the other side, while allowing for the simultaneous soldering of both the pigtails 32 of the electronic components and the ends of the hookup wire sections 43 about their respective lug 18 integral with the turret terminals 16. This step in the fabrication is accomplished by the utilization of the heat resistant insulator 20 on the turret terminals 16, and of a similar type insulator 44 on the hookup wire sections 43 to which solder will not adhere.

Figure 5:
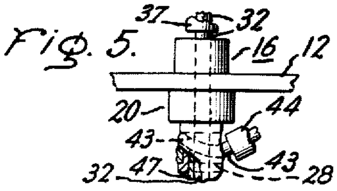
FIGURE 5 is a side view of one of the hollow-turret terminals illustrating the excellent contact obtained by the dip-soldering step of the present invention.

Accordingly, FIGURE 4 illustrate the dip-soldering step of the present invention, wherein the pigtails 32 of the electronic components and ends of the hookup wire sections 43, through the medium of the common metal lug 18, are joined in an extremely reliable electrical joint as seen from FIGURE 5, the solder joint being designated by numeral 47. Each of the pigtails 32 of the electronic components, when initially inserted within its respective lug 18, leaves a very small area therebetween, as seen in FIGURE 2, which in the final step of the present invention, may allow a sufficient amount of solder to enter. However, the penetration of solder into the hollow-turret terminal is not essential as the solder fillet formed between the flange 28 and the protruding pigtail 32, as shown in FIGURE 5, is adequate to form a rigid coupling between the pigtails 32, turret 30 of the lug 18, and the end of the hookup wire section 43 fixed thereto. With this type of fabrication, visual inspection will indicate whether complete contact between the pigtails and the ends of hookup wire sections on the hollow-turret terminal side of the panel 12 has been achieved.

In summary, in accordance with the principles of the present invention, a punch-board wiring circuit is fabricated by utilizing a plurality of hollow-turret terminals 16 pressure-fitted by means of heat resistant insulator mounting means in a metal chassis or panel 12 in any specific pattern required by the installation, and finally, simultaneously soldering the pigtails 32 of the electronic components extending through each turret terminal, and the ends of the hookup wire sections 43, tied to their respective turret terminal, in one operation without having the chassis 12 contacting the solder.

To clearly illustrate the present invention, each of the process steps have been shown as separate and distinct operations that may be performed by hand. However, these different operations may be combined and mechanized to enable a rapid and inexpensive assembly line fabrication of these punch-board wiring circuits. For example, the chassis 12 may be placed in a jig and mounting apertures 14 drilled therein in accordance with a predetermined circuit pattern or in an uniformly perforated manner. Thereafter the terminals 16 are automatically pressure fitted into the chassis in accordance with the specific circuit pattern or in a predetermined pattern utilizing only part of the apertures. Next in sequence, fluxing the turrets and ends of the hookup wire sections located on one side of the panel and, finally, dipping in a solder bath to form a rigid electrical contact at each turret without getting solder on the panel 12.

Since these and many other variations may be made, both in the individual steps and in the combination of these steps in carrying out the present invention in accordance with the teaching herein, it is intended that this invention is to cover all changes and modifications of the example of the invention herein chosen for the purpose of the disclosure, which do not constitute departures from the spirit and scope of the invention as set forth in the appended claims.

What is claimed is:

1. The method of making a punch board wiring circuit comprising the steps of: forming a metal chassis by punching a plurality of apertures through a metal panel in a predetermined pattern, press fitting an insulator containing a hollow-turret terminal in each of said apertures so that all of said terminals project from a first side of said chassis, securing a number of electronic components leaving pigtails on the second side of said chassis and inserting the components pigtails through their predeterminedly related terminals so as to extend a predetermined length from the terminals protruding from said first side, electrically coupling the various related turrets by means of hookup wire section having heat resistant insulation thereon and prepared by removing heat resistant insulation from the ends thereof but leaving such insulation on the wire portions removed from said ends, wrapping the ends of said wire sections around their respective turrets, fluxing the turrets and the pigtail extending therethrough along with the ends of said wire sections tied thereto, and in sequence, immersing said first side of said chassis in a bath of solder, a slight distance past the ends of the hollow-turret terminals to completely cover the turrets and the hookup wire sections, and removing the completed punch board wiring circuit from the bath of solder whereupon the solder will harmlessly run-off the heat resistant insulator portions of the hollow-turret terminals and the hookup wire sections.

2. The method of fabricating a punchboard wiring circuit comprising the steps of: preparing a metal panel as a receptacle for an electronic assembly by punching apertures therethrough in a predetermined pattern, securing insulators containing hollow-turret terminals in said apertures, each of said terminals having a metal turret protruding only from a first side of said panel and the metal turret being separated from the panel by a heat resistant portion of said insulator, mounting pigtail-carrying electronic components with their respective pigtails disposed on only the second side of the panel and inserting each of said pigtails through its respective terminal, predeterminedly wiring the terminals on said first side of said panel with heat resistant-insulator covered wire sections, and dip-soldering said first side of said panel to solder the ends of said wire sections and said pigtails without exposing said panel to solder which harmlessly rolls off the heat resistant insulators.

References Cited in the file of this patent

UNITED STATES PATENTS

| | | |
|---|---|---|
| 1,837,962 | Hensgen | Dec. 22, 1931 |
| 2,177,377 | Polivka | Oct. 24, 1939 |
| 2,390,706 | Hearon | Dec. 11, 1945 |
| 2,633,630 | Woods et al. | Apr. 7, 1953 |
| 2,682,018 | Phillips | June 22, 1954 |
| 2,694,249 | Kapp | Nov. 16, 1954 |
| 2,695,351 | Beck | Nov. 23, 1954 |
| 2,740,193 | Pessel | Apr. 3, 1956 |
| 2,803,788 | Sanders | Aug. 20, 1957 |
| 2,848,793 | Pityo | Aug. 26, 1958 |
| 2,884,612 | Bang | Apr. 28, 1959 |
| 2,885,601 | Pessel | May 5, 1959 |

UNITED STATES PATENT OFFICE
CERTIFICATE OF CORRECTION

Patent No. 3,088,191 May 7, 1963

Robert W. Breiling

It is hereby certified that error appears in the above numbered patent requiring correction and that the said Letters Patent should read as corrected below.

Column 5, line 42, for "leaving" read -- having --.

Signed and sealed this 11th day of February 1964.

(SEAL)
Attest:

ERNEST W. SWIDER
Attesting Officer

EDWIN L. REYNOLDS
Acting Commissioner of Patents